United States Patent [19]

Loualiche et al.

[11] Patent Number: 5,041,778
[45] Date of Patent: Aug. 20, 1991

[54] ELECTROOPTIC MEASUREMENT SYSTEMS FOR FREQUENCY ANALYSIS OF VERY WIDE RANGE SIGNALS

[75] Inventors: Slimane Loualiche, Lannion; Francois Salin, Paris, both of France

[73] Assignee: Etat Francais Represente par le Ministre des Postes, Telecommunications et de l'Espace (Centre National d'Etudes des Telecommunications), Issy-les-Moulineaux, France

[21] Appl. No.: 380,445

[22] Filed: Jul. 17, 1989

[30] Foreign Application Priority Data

Jul. 19, 1988 [FR] France .................. 88 09735

[51] Int. Cl.⁵ .................................................. G01R 23/16
[52] U.S. Cl. ................................................... 324/77 K
[58] Field of Search ............... 324/77 K, 77 B, 96; 350/355, 374, 384, 404; 356/352, 365, 368

[56] References Cited

U.S. PATENT DOCUMENTS 4,417,815  11/1983  Murray et al. .................. 356/352
4,465,969  8/1984   Tada et al. ...................... 324/96
4,618,819  10/1986  Mourou et al. .................. 324/96
4,891,580  1/1990   Valdmanis ..................... 324/77 K

OTHER PUBLICATIONS

Janis A. Valdmanis et al, "Subpicosecond Electrooptic Sampling: Principles and Applications", IEEE Journal of Quantum Electronics, vol. QE-22, No. 1, Jan. 1986, pp. 69–78.

Primary Examiner—Hezron E. Williams
Assistant Examiner—Louis M. Arana
Attorney, Agent, or Firm—Lowe, Price, LeBlanc & Becker

[57] ABSTRACT

A spectrum analyzer for a variable amplitude and frequency electric signal includes an optical modulator responsive to the signal that derives a first optical wave having intensity and frequency components corresponding to the signal amplitude and frequency components. An optical analyzer responds to the first optical wave to derive a second optical wave having intensity variations at frequency components corresponding to the amplitude of the electric signal at the frequencies in the spectrum of the signal. The optical analyzer includes a tunable optical cavity responsive to the first optical wave to derive the second optical wave.

14 Claims, 3 Drawing Sheets

ELECTROOPTIC MEASUREMENT SYSTEMS FOR FREQUENCY ANALYSIS OF VERY WIDE RANGE SIGNALS

BACKGROUND OF THE INVENTION

1. Field of the Invention

This invention relates in general to the measurement of electrical signals of very wide frequency range. More particularly, the invention relates to the measurement of the frequential characteristics of electrical signals of very wide frequency range by a method of electrooptic measurement.

2. Description of the Prior Art

J. A. VALDMANIS and G. MOUROU recently developed a method for measuring the waveform of an electrical signal of very wide range by electrooptic sampling. This measurement method enables temporal resolution of approximately one picosecond to be achieved. In the article entitled "Subpicosecond Electrooptic Sampling:Principles and Applications" which was published in the IEEE JOURNAL OF QUANTUM ELECTRONICS, VOL. QE-22, No. 1, JANUARY 1986, J. A. VALDMANIS and G. MOUROU describe the general configuration of an electrooptic sampling measurement system.

This electrooptic sampling measurement system utilizes the existence of birefringence in certain crystals with an electrooptic property. When a rectilinearly polarized light wave encounters an electrical wave produced by an electrical signal in a berefringent crystal, its polarization is rotated as a result of the interaction with the electrical wave. By placing itself in particular geometrical conditions, the interaction between the two waves induces a phase lag in the light wave. The light wave observed in cross-polarization then has an intensity modulated by the electrical signal and the variations in intensity of the light wave need only be measured by an optical detector to retrace the electrical signal. To achieve very good temporal resolution, a light wave formed by a pulse train of very small width is used to sample the electrical signal, it is possible to explore the temporal evolution of the electrical signal. The method is similar to stroboscopics for repetitive signals. The measurement of the intensity of the light wave is carried out at very low frequency and consequently with a conventional, very low noise and high-performance optical detector.

The temporal resolution of a system of measurement by electrooptic sampling is higher than that of conventional measurement systems of the purely electronic type such as the sampling oscilloscope. This superiority is mainly due to the fact that the polarization rotation of the light wave in the electrooptic crystal is an instantaneous phenomenon which does not have a measurable time constant as a result of which the main limitation of the temporal resolution of such a system is the width of the sampling pulses of the light wave.

However, the main drawback of electrooptic sampling measurement systems is in the fact that it is necessary to utilize a pulsing laser source which issues light pulses of very small width, i.e. subpicosecond. In fact, a laser source of this type usually has a length of several meters and is therefore very cumbersome. Moreover, it is difficult to adjust and is relatively expensive. Another major drawback of this measurement system is that it is only possible to measure signals with repetition frequencies that are multiple integers of the repetition frequency of the light pulses issued by the laser source. It can be conclued from these two drawbacks that electrooptic sampling measurement systems are as yet experimental systems that are difficult to industrialize and market.

OBJECT OF THE INVENTION

The object of this invention is to obviate the preceding drawbacks, particularly to provide electrooptic systems for frequency analysis of electrical systems with temporal performances at least equal to those of the electrooptic sampling measurement systems but which do not have the above-mentioned drawbacks.

SUMMARY OF THE INVENTION

Accordingly, an electrooptic system embodying the invention for frequency analysis of an electrical signal, therein comprises means for continuously producing and transmitting a first monochromatic coherent light wave of constant intensity, means for linearly modulating in amplitude the first light wave according to the electrical signal to be analyzed, thereby producing a second light wave modulated in amplitude, and spectroscopic means for characterizing the frequencies of the electrical signal to be analyzed from the second light wave modulated in amplitude.

The electrooptic systems embodying the invention are mainly in the form of frequency meters and spectrum analysers.

In the case of an electrooptic system embodying the invention in the form of a frequency meter, the spectroscopic means preferably comprises tunable means for frequency measurement to receive the second light wave and to issue in response a frequency light component of the second light wave, with a frequency equal to a frequency of which are tuned said tunable frequency measuring means, and means for detecting the intensity of said frequency light component.

In the case of an electrooptic measurement system embodying the invention in the form of a spectrum analyser, the spectroscopic means preferably also comprises means for successively controlling the tuning of the tunable frequency measurement means to different frequencies in a frequency range to be explored, and means receiving a frequency sweep signal produced by said controlling means and representative of the explored frequency range and an intensity signal produced by said detecting means and representative of the intensities of the frequency light components of the second light wave corresponding respectively to the different frequencies of the explored frequency range, to visualize the frequency spectrum of the second light wave corresponding to the explored frequency range and to deduct from this the frequential characteristics of the electrical signal to be analyzed.

In accordance with a further aspect of the invention a spectrum analyzer for an electric signal susceptible of having variable amplitude and frequency components over a predetermined spectrum comprises optical modulator means responsive to the signal for deriving a first optical wave having intensity and frequency components corresponding to the amplitude and frequency components of the signal. Optical analyzer means responds to the first optical wave to derive a second optical wave having intensity variations at frequency components corresponding to the amplitude of the electric signal at the frequencies in the spectrum. The optical analyzer means includes a tunable optical cavity responsive to the first optical wave for deriving the second optical wave. The tunable optical cavity is tuned over the frequencies of the spectrum.

BRIEF DESCRIPTION OF THE DRAWING

The foregoing and other objects, features and advantages of the invention will be apparent from the following detailed description of several embodiments of the invention with reference to the corresponding accompanying drawings in which.

DESCRIPTION OF THE PREFERRED EMBODIMENTS

Figure 1:
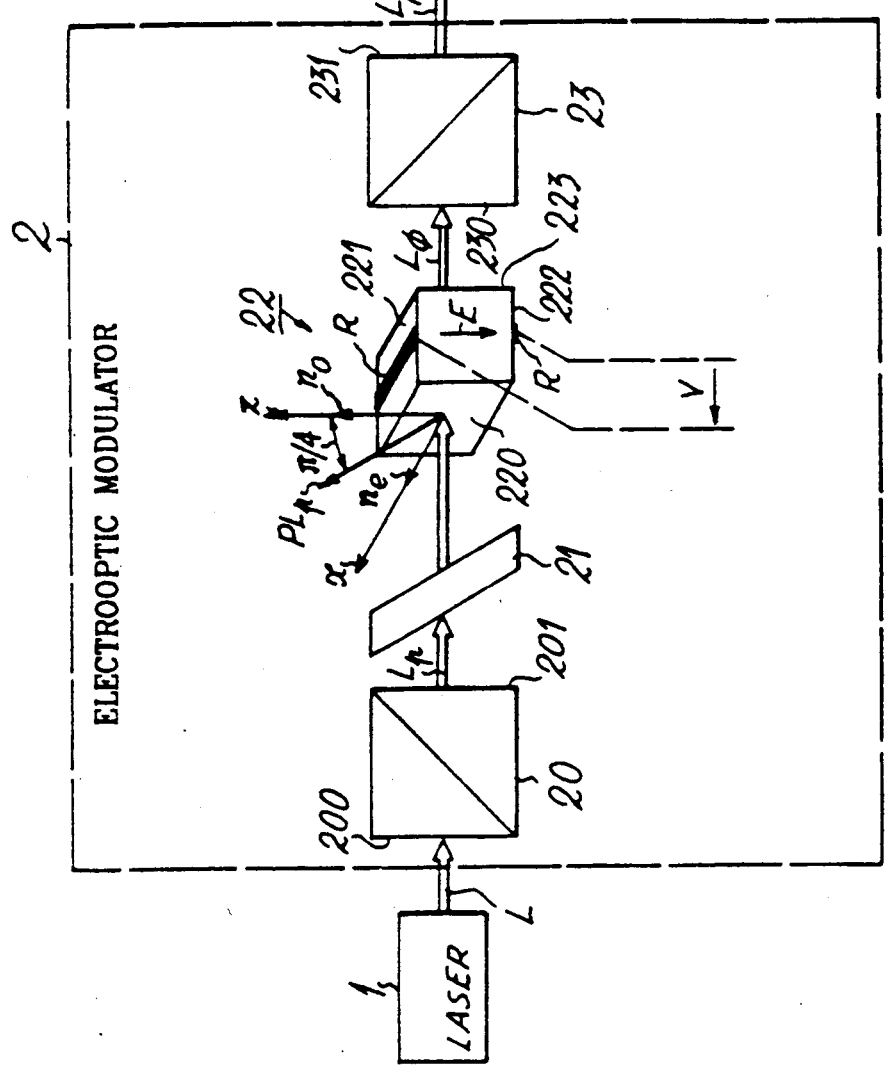
FIG. 1 is a general block diagram of an electrooptic measurement system embodying the invention in the form of a spectrum analyzer.

In reference to FIG. 1, the electrooptic spectrum analyzer embodying the invention comprises a laser source 1, an electrooptic modulator 2, and a spectroscopic device 3.

The laser source 1 is of the monochromatic, continuous transmission type and has a very small line width. The laser source 1 is e.g. comprised of a Helium-Neon (He-Ne) type gas laser source, of stabilized frequency and transmitting a light i.e., optical wave L of wavelength $\lambda_O$, of frequency $\nu_O$ and of very small line width $\Delta\nu$.

The electrooptic modulator 2 is a POCKELS cell comprising a polarizer 20, a compensator 21, a crystal 22 with electrooptic property, and a polarizer-analyser 23.

The polarizer 20 is e.g. comprised of a GLAN or NICOLL prism. It receives the light wave L supplied by the laser source 1 to a first side 200 and issues a rectilinearly polarized light wave $L_P$ by a second side 201. The light wave $L_p$ is applied through the compensator 21 to a first side 220 of the crystal 22.

The compensator 21 is of the quarter-wave $\lambda_O/4$ type and its purpose is to introduce a phase lag $\Gamma_O = \pi/2$ in the light wave $L_p$ so as to polarize the modulator 2 in a linear part of its frequency response curve as will appear more clearly further in the description.

The electrooptic crystal 22 is e.g. comprised of a parallelepiped shaped ADP crystal $(NH_4)H_2PO_4$. The crystal 22 comprises perpendicular crystallographic axes x and z to which extraordinary $n_e$ and ordinary $n_o$ refraction coefficients correspond respectively. The first side 220 of the crystal 22 is parallel to the plane defined by the crystallographic axes x and z. Second and third parallel sides 221 and 222 of the crystal 22 which are perpendicular to the first side 220 bear ribbon conductors R between which is applied an electrical signal V to be analyzed.

The electrical signal V produces in the crystal 22 a transversal electric field E perpendicular to the propagation direction of the light wave $L_p$ and parallel to the crystollographic axis z of the crystal 22. The light wave $L_P$ incurs a phase lag $\Delta\Gamma$ during the crossing of the crystal 22. The phase lag $\Delta\Gamma$ is a function of electrical signal V whose amplitude variations introduce into the crystal 22 modifications in its hirefringence property, i.e. variations in the refraction coefficients $n_o$ and $n_e$, the difference $n_o - n_e$ being substantially proportional to the electrical signal V.

The phase lag $\Delta\Gamma$ introduced in the light wave $L_p$ during its crossing of the crystal 22 is expressed by the equality:

$$\Delta\Gamma = \pi.(V/V_\pi),$$

whereby $V_\pi$ is a characteristic parameter of the crystal 22 and of the wavelength $\lambda_O$ of the light wave $L_p$; the parameter $V_\pi$ being of the order of one kilovolt.

A light wave $L_\phi$ phase modulated according to the electrical signal V is produced by the crystal 22. The light wave $L_\phi$ is supplied by a fourth side 223 of the crystal 22, and is applied to a first side 230 of the polarizer-analyzer 23.

The polarizer-analyzer 23 is of a type analogous to the polarizer 20. It is oriented crossways to the polarizer 20 and its direction is therefore at $\pi/2$ from the direction of the polarizer 20. Via a second side 231 parallel to the first side 230, the polarizer 23 supplies a light wave $L_A$ in rectilinear cross-polarization by comparison with the light wave $L_p$. The amplitude modulation of the light wave $L_A$ is a function of the electrical signal V.

Preferably, to achieve maximum amplitude modulation of light wave $L_A$, with a modulation index equal to 1, thereby ensuring maximum measurement sensitivity, the light wave $L_p$ has a polarization plane $PL_P$ oriented, as shown in FIG. 1, at $\pi/4$ to the crystallographic axes x and z of the crystal 22, which is achieved by suitably orienting the polarizer 20 by comparison with the crystal 22. In these conditions, the intensity $IL_A$ of the light wave $L_A$ is expressed by the following equality:

$$IL_A = IL_O \cdot \sin^2((\Gamma_O + \Delta\Gamma)/2) = (IL_O/2)(1 - \cos(\Gamma_O + \Delta\Gamma))$$

whereby $IL_O$ is the maximum amplitude of the intensity $IL_A$.

The phase lag $\Gamma_O$ introduced by the compensator 21 being equal to $\pi/2$, the intensity $IL_A$ of the light wave $L_A$ according to the electrical signal V is expressed by:

$$IL_A = (IL_O/2).(1 + \sin(\pi.V/V_{90})).$$

Figure 2:
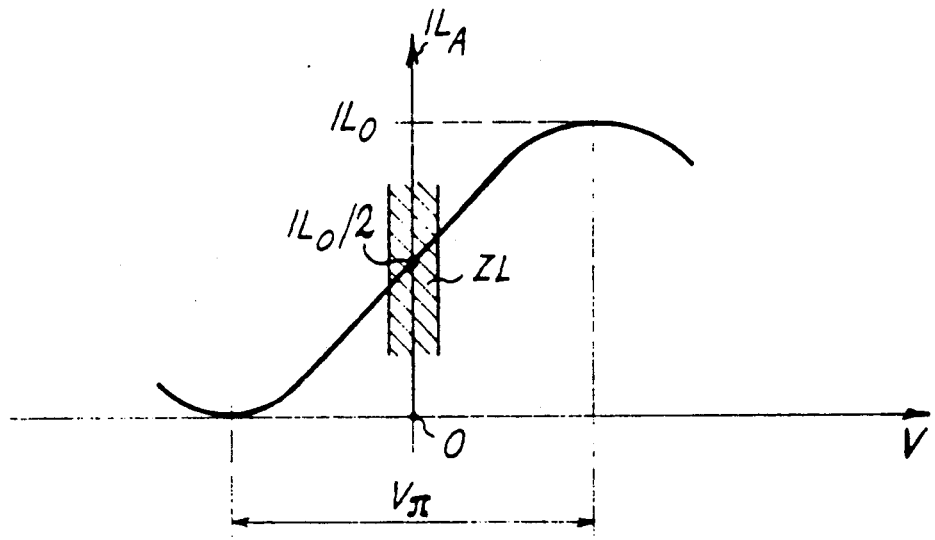
FIG. 2 is the frequency response curve of a POCKELS effect electrooptic modulator included in the electrooptic measurement system represented in FIG. 1.

This last relation is illustrated by the response curve of the electrooptic modulator 2 shown in FIG. 2.

The amplitude of the electrical signal V is usually very low in comparison with the value of the parameter $V_{90}$ of the order of one kilovolt, as a result of which the ratio $V/V_\pi$ is very low and the modulator 2 operates in a linearity zone ZL. In the linearity zone ZL the intensity $IL_A$ according to the signal V is expressed by the equality:

$$IL_A \approx (IL_O/2).(1 + \pi.V/V_{90}).$$

Figure 3:
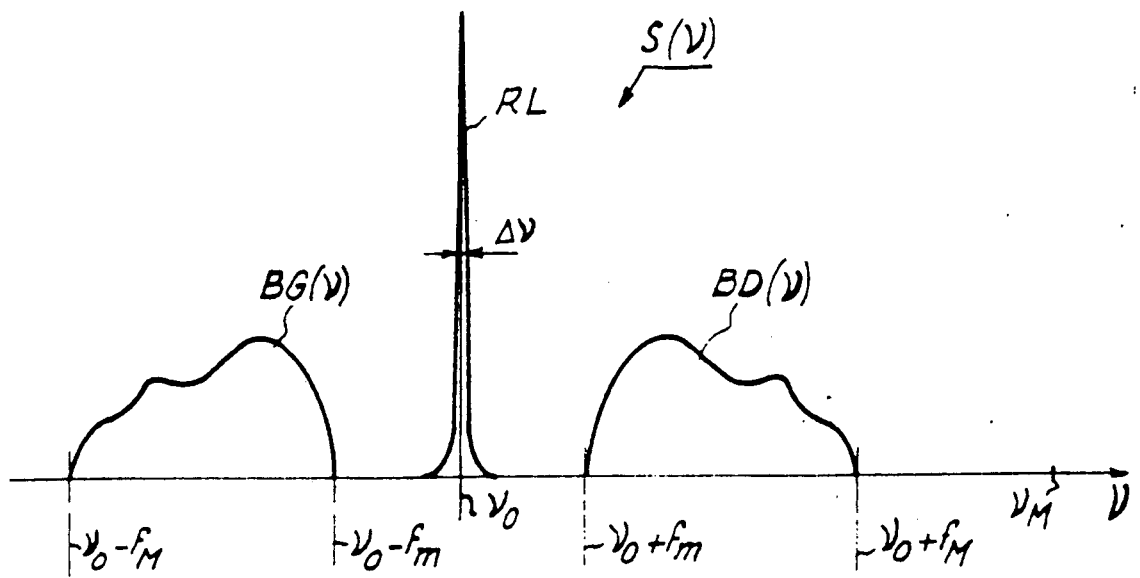
FIG. 3 is a plot of the frequency spectrum of a light wave modulated in amplitude by the electrooptic modulator according to the electrical signal to be analyzed.

In reference to FIG. 3, the light wave $L_A$ modulated linearly in amplitude by the electrical signal V has a frequency spectrum $S(\nu)$ comprising a frequency line RL at frequency $\nu_O$ corresponding to the light wave transmitted by the laser source 1, and two sidebands $BD(\nu)$ and $BG(\nu)$ due to the amplitude modulation of the wave $L_A$ and corresponding to the frequency spectrum B(f) of the electrical signal V.

The sidebands $BD(\nu)$ and $BG(\nu)$ have extreme upper and lower frequencies respectively equal to $\nu_O - f_M$ and $\nu_O - f_m$, and $\nu_O + f_m$ and $\nu_O + f_M$, whereby $f_m$ and $f_M$ are respectively extreme upper and lower frequencies of the frequency spectrum B(f) of the signal V. The sidebands $BD(\nu)$ and $BG(\nu)$ are associated with the frequency spectrum B(f) by the equalities:

$$BG(\nu) = B(\nu_O - f), \text{ and}$$

$$BD(\nu) = B(\nu_O + f).$$

The light wave $L_A$ therefore carries all the information relating to the electrical signal V to be analyzed and it is easy, knowing the frequency spectrum B(f) of the signal V, to deduct from it the frequency spectrum B(f) of the signal V.

In reference to FIG. 1, the purpose of the spectroscopic device 3 is to analyze the frequency of the spectrum of the light wave $L_A$ in order to determine the spectrum B(f) of the electrical signal V.

The spectroscopic device 3 is e.g. comprised of a FABRY-PEROT sweeping interferometer 30, a photodiode-equipped optical detector 31, and an oscilloscope 32.

The FABRY-PEROT sweeping interferometer is a well known device to those skilled in the art and its functioning will not be described in detail here. It comprises essentially a tunable cavity 300 and a sweep generator 301. The light wave $L_A$ is injected into the cavity 300 through a first semi-transparent wall 3000. A second semi-transparent wall 3001 of the cavity 300 is fitted with a piezoelectrical control device and its position is mobile in comparison with the first wall 3000. Displacement of the wall 3001 is controlled by a low-frequency sweep ramp signal BA. Controlled by the ramp signal BA, the cavity 300 is successively tuned to different frequencies in a frequency range to be explored and issues corresponding frequency light components CF through the second wall 3001.

A photodiode 310 of the optical detector 31 receives the frequency light components supplied by the cavity 300 and issues in response a current that is representative of the intensity of said components. From the current issued by the photodiode 310, the detector 31 produces an intensity signal IF representing the intensity of the different frequency light components CF in the explored frequency range.

The sweep ramp signal BA and the intensity signal IF are respectively applied at inputs X and Y of the oscilloscope 32 so as to visualize the frequency spectrum $S(\nu)$ on the cathode screen of the oscilloscope 32.

Preferably, the cavity 300 is selected so as to have a free frequency interval included between the frequency $\nu_O$ and a maximum frequency $\nu_M$ (FIG. 3) which includes the sideband BD $(\nu)$ of the frequency spectrum $S(\nu)$. This free temporal interval is swept under the control of the sweep ramp signal BA and, the frequency line $\nu_O$ being taken as origin of frequency f=0 Hz, only the frequency spectrum B(f) is thereby displayed on the screen of the oscilloscope 32.

The electrooptic spectrum analyzer embodying the invention can also be used to characterize electronic components and hyperfrequency microcircuits on a semiconducting substrate. In this way, e.g. when the microcircuit substrate is comprised of a crystal with an electrooptic property such as gallium arsenide (GaAs), it is then possible to analyze electrical signals in situ, without recourse to contact or connection by wires, by using the electrooptic property of the substrate to modulate the light wave.

Figure 4:
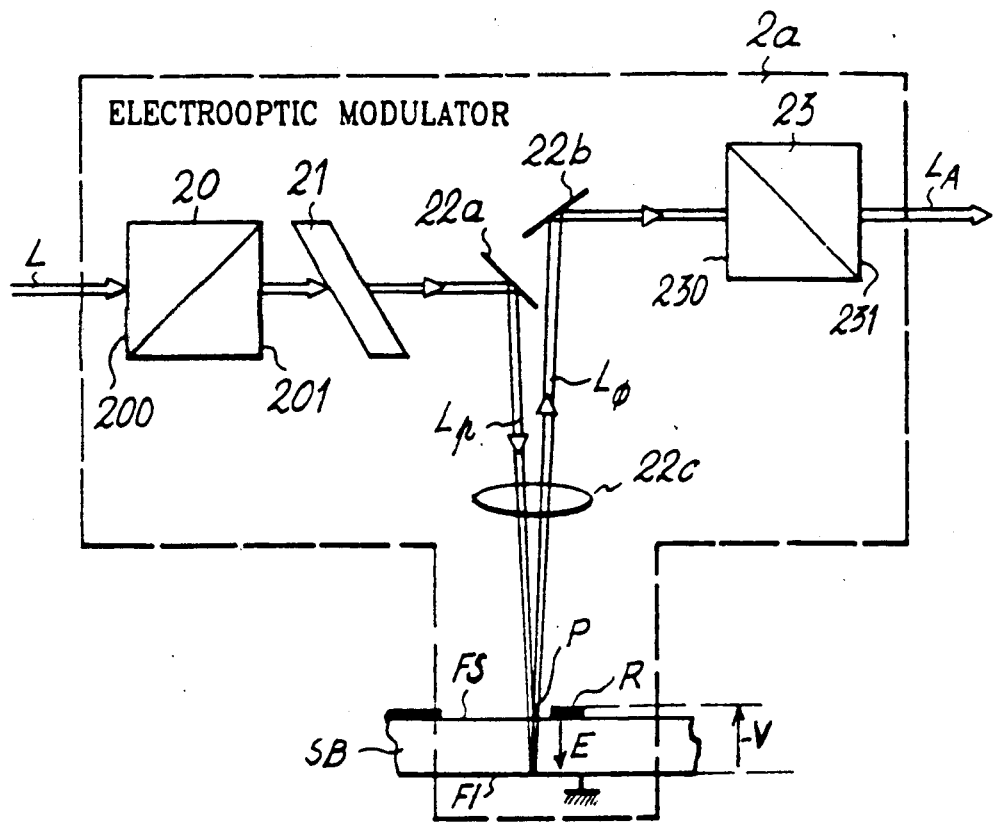
FIG. 4 is a schematic diagram of a particular embodiment of the electrooptic modulator for contactless and in situ analysis of the electrical signals produced in a microcircuit or an electronic component produced on a crystalline substrate with an electrooptic property.

In reference to FIG. 4, an electrooptic modulator 2a for in situ analysis of an electrical signal V in a microcircuit carried out on an electrooptic crystalline substrate SB comprises a polarizer 20, a compensator 21, two analogous mirrors 22a and 22b, a focusing lens 22c, and a polarizer-analyzer 23.

The polarizer 20, the compensator 21 and the polarizer-analyzer 23 are analogous to those included in the modulator 2 shown in FIG. 1 and have the same functions. In the modulator 2a, the electrooptic crystal 22 (FIG. 1) is suppressed and the phase modulation of the polarized light wave $L_p$ is carried out directly in the electrooptic crystalline substrate SB.

The rectilinearly polarized light wave $L_p$ coming from the compensator 21 is oriented by the mirror 22a towards a point P in the vicinity of a ribbon conductor R situated on an upper side FS of the substrate SB. The ribbon conductor R carries the electrical signal V to be analyzed. The light wave $L_p$ is applied to the point P of the substrate SB through the focusing lens 22c.

The purpose of the focusing lens 22c is to diminish the spatial resolution of the measurement by focusing the light wave $L_p$ on the point P which diminishes in area and can therefore be throught nearer the ribbon conductor R.

The light wave $L_p$ is directed towards the point P with an angle of incidence substantially lower than $\pi/2$ and propagates in the substrate SB until it reaches a metallized lower side FI which is at a reference voltage. At the lower side FI, the light wave $L_p$ is reflected back towards the upper side FS. The light wave exiting from the substrate SB via the upper side FS is phase modulated and forms the light wave $L_\phi$. In the substrate SB, the electrical signal V produces an electric field E substantially longitudinal to the propagation directions of the incident and reflected light waves. By electrooptic effect, the light waves propagating in the substrate SB are subjected to a phase lag according to the electrical signal V.

The light wave $L_\phi$ exiting the substrate SB goes through the focusing lens 22c and is directed towards the first side 230 of the polarizer-analyzer 23 by the mirror 22b. Through the second side 231, the polarizer-analyzer 23 issues the light wave $L_A$ which is rectilinearly polarized and amplitude modulated by the electrical signal V.

Figure 5:
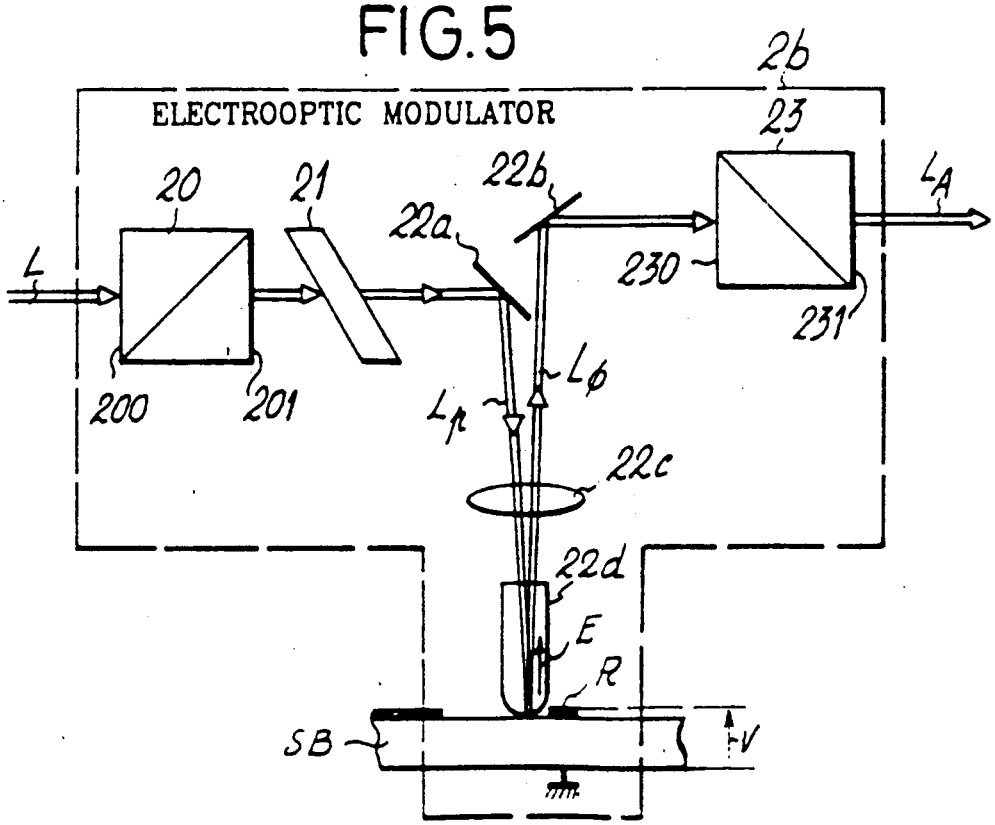
FIG. 5 is a schematic diagram of another particular embodiment of the electrooptic modulator comprising a measurement probe in electrooptic crystal for contactless and in situ analysis of electrical signals.

In the case of the substrate SB supporting the microcircuit to be characterized not having any electrooptic property, an electro-optic modulator 2b, shown in FIG. 5, comprising a measurement probe 22d in electrooptic crystal can be used. The probe 22d is then positioned near the ribbon conductor R carrying the electrical signal V so that the probe 22d may be crossed by lines of the electric field E produced by the signal V. It is thus possible to analyze the electrical signal V without any connection between the ribbon conductor R and the eleotroptic modulator 2b.

The invention can be embodied in many ways other than those described in reference to FIGS. 1 to 5.

As regards the spectroscopic device 3 included in the analyzer and described in reference to FIG. 1, other types of sweeping interferometers can therefore be used. It is not always desirable to have the spectrum of the signal to be analyzed represented on the oscilloscope. In this case the spectroscopic device is e.g. comprised of a spectograph with a dispersing element issuing a spectrum recording on a paper support.

Furthermore, when exact knowledge of the spectrum is not necessary and e.g. the fundamental frequency of the signal is required, the invention may take on the form of a frequency meter and comprise e.g. a MICHELSON interferometer which is manually adjusted until the photodiode-equipped optical detector 31 issues a maximum response indicating that the interferometer is tuned to the fundamental frequency. A reading of the interferometer's graduated slide contact then indicates the relevant value of the fundamntal frequency of the signal.

The performances of an electrooptic spectrum analyzer embodying the invention are essentially limited by the performances of the interferometer included in the spectroscopic device and by the stability of the width of the line of the light wave produced by the laser source. A particular embodiment of the spectrum analyzer embodying the invention comprised of a FABRY-PEROT interferometer and a laser source currently marketed achieves the following performances for contactless in situ measurement:

pass range of a few kilohertz to 8,000 GHz,
sensitivity lower than 1 mV,
spectral resolution substantially equal to 1 kHz, and
spatial resolution of a few micrometers.

What we claim is:

1. An electrooptic system for frequency analyzing an electric signal susceptible of having variable amplitude and frequency components comprising
    means for deriving a first monochromatic coherent optical wave having constant intensity,
    electrooptic means responsive to said electrical signal for linearly amplitude modulating said first light wave into an amplitude-modulated optical wave having amplitude and frequency components corresponding with the amplitude and frequency components of the electric signal,
    tunable frequency-measurement means responsive to said amplitude-modulated optical wave for deriving optical components having frequency components corresponding in intensity to frequency and amplitude components of said amplitude-modulated optical wave, said optical components having frequencies equal to frequencies to which, said tunable frequency-measurement means is tuned,
    means for generating a frequency sweep signal in a frequency range to be explored, said frequency sweep signal being applied to said tunable frequency-measurement means for successively tuning said tunable frequency-measurement means to different frequencies within said frequency range,
    photodetector means for detecting intensities of said frequency optical components thereby deriving an intensity signal, and
    means responsive to said frequency sweep signal and said intensity signal for visualizing the frequency spectrum of said amplitude-modulated light wave corresponding to said explored frequency range to thereby determine frequency characteristics of said electrical signal to be analyzed.

2. The system of claim 1 wherein said tunable frequency-measurement means comprises a FABRY-PEROT sweep interferometer.

3. The system of claim 1 wherein said tunable frequency-measurement means comprises a spectrograph having a dispersing element.

4. The system of claim 1 wherein said coherent optical wave deriving means comprises a continuous laser source having a stabilized frequency and small line width.

5. The system of claim 1 wherein said electrooptic modulating means comprises a polarizer for rectilinearly polarizing said first optical wave into a polarized optical wave, an electrooptic crystal responsive to said polarized optical wave and bearing ribbon conductors between which said signal is applied thereby deriving a phase-modulated optical wave as a function of said signal, and a polarizer-analyzer responsive to said phase-modulated light wave for deriving said amplitude-modulated optical wave.

6. The system of claim 5 wherein said electrooptic crystal includes a crystalline substrate of an electronic circuit in which is established an electric field induced by said signal.

7. The system as claimed in claim 1 wherein said electrooptic modulating means comprises a polarizer for rectilinearly polarizing said first optical wave into a polarized optical wave, an electronic circuit having ribbon conductors between which said electrical signal is applied, an electrooptic crystal measurement probe responsive to said polarized optical wave positioned near one of said conductors whereby said probe is subjected to an electric field induced by said electrical signal to derive a phase-modulated optical wave as a function of said electrical signal, and a polarizer-analyzer responsive to said phase-modulated optical wave modulated for deriving said amplitude-modulated optical wave.

8. A spectrum analyzer for an electric signal susceptible of having variable amplitude and frequency components over a predetermined spectrum comprising
    optical modulator means responsive to the signal for deriving a first optical wave having intensity and frequency components corresponding to the amplitude and frequency components of the signal, and
    optical analyzer means responsive to the first optical wave for deriving a second optical wave having intensity variations at frequency components corresponding to the amplitude of the electric signal at the frequencies in the spectrum, said optical analyzer means including a tunable optical cavity responsive to the first optical wave for deriving the second optical wave, said tunable optical cavity being tuned over the frequencies of the spectrum.

9. The spectrum analyzer of claim 8 further including means responsive to the second optical wave for deriving an x-y display of the amplitude versus frequency response of the electric signal, said indication deriving means including a variable frequency source for varying the tuned frequency of the cavity, said display being responsive to the intensity of the second wave and the frequency of the variable frequency source so that the intensity of the second wave and the frequency of the variable frequency source are displayed in synchronism in the coordinate directions of the display.

10. The spectrum analyzer of claim 8 wherein said optical modulator comprises a polarizer for rectilinearly polarizing an input optical wave into a polarized optical wave, an electrooptic crystal responsive to said polarized optical wave including electrodes between which said electrical signal is applied to thereby derive a phase-modulated optical wave as a function of said electrical signal, and a polarizer-analyzer receiving said phase-modulated light wave for deriving said first optical wave.

11. The spectrum analyzer of claim 10 wherein said electrooptic crystal includes a crystalline substrate of an electronic circuit in which is established an electric field induced by said electrical signal.

12. The spectrum analyzer of claim 8 wherein said modulator means comprises a polarizer for rectilinearly polarizing an input optical wave into a polarized optical wave, an electronic circuit having electrodes between which said signal is applied, an electrooptic crystal measurement probe responsive to said polarized optical wave positioned between said electrodes whereby said probe is subjected to an electric field induced by said signal to derive a phase-modulated optical wave as a function of said electrical signal, and a polarizer-analyzer responsive to said phase-modulated optical wave modulated for deriving said first optical wave.

13. The system of claim 8 wherein said tunable cavity comprises a FABRY-PEROT sweep interferometer.

14. The spectrum analyzer of claim 8 wherein said tunable cavity comprises a spectrograph having a dispersing element.

* * * * *